United States Patent [19]

Gregoire

[11] Patent Number: 5,334,279

[45] Date of Patent: Aug. 2, 1994

[54] METHOD AND APPARATUS FOR MAKING PRINTED CIRCUIT BOARDS

[76] Inventor: George D. Gregoire, 9927 Aviary Dr., San Diego, Calif. 92131

[21] Appl. No.: 113,392

[22] Filed: Aug. 27, 1993

Related U.S. Application Data

[62] Division of Ser. No. 45,366, Apr. 8, 1993.

[51] Int. Cl.$^5$ .................. B44C 1/22; C23F 1/00
[52] U.S. Cl. .................. 156/630; 156/634; 156/645; 156/656; 156/659.1; 156/902; 156/905; 156/150; 156/245; 156/289; 156/500; 428/156; 428/163; 428/167; 428/209; 428/901
[58] Field of Search ............... 156/630, 631, 634, 645, 156/654, 655, 659.1, 901, 660, 902, 905, 150, 151, 233, 298, 242, 245, 656, 289, 500; 29/846, 848, 849; 428/156, 163, 167, 209, 901; 430/313, 318, 323; 264/232, 233, 255, 265, 266, 272.15, 272.17, 278, 511

[56] References Cited

U.S. PATENT DOCUMENTS

| | | | |
|---|---|---|---|
| 3,201,238 | 8/1965 | Dwyer | 156/645 X |
| 3,209,066 | 9/1965 | Toomey et al. | 156/901 X |
| 3,303,254 | 2/1967 | Simons | 156/654 X |
| 4,059,479 | 11/1977 | Tanazawa | 156/905 X |
| 4,944,908 | 7/1970 | Leveque et al. | 156/902 X |
| 4,969,257 | 11/1990 | Sato et al. | 29/842 |
| 5,168,624 | 12/1992 | Shirai | 29/846 |

Primary Examiner—William Powell
Attorney, Agent, or Firm—Bernard L. Kleinke; Jerry R. Potts

[57] ABSTRACT

A new and improved printed circuit board tool and method of making and using it, to produce three dimensional printed circuit boards having grooves with strongly bonded or laminated metallic pads therein. The printed circuit board tool includes a metallized male mold substrate having a plurality of groove forming projections disposed in the substrate surface. The method of making the metallized mold includes forming a female parent or predecessor master tool that may be used to produce a large number of the metallized male molds for producing new and improved three-dimensional printed circuit boards. The new and improved three-dimensional printed circuit board includes a substrate composed of a high heat deflective plastic, and a plurality of recesses or grooves molded into the substrate surface for receiving therein the fine pitch, closely spaced-apart leads of an integrated circuit. A plurality of metallized sunken pads or lands are adhered or bonded within the grooves for establishing an electrical path within each groove.

14 Claims, 3 Drawing Sheets

5,334,279

METHOD AND APPARATUS FOR MAKING PRINTED CIRCUIT BOARDS

This is a division of application Ser. No. 08/045,366, filed on Apr. 8, 1993.

TECHNICAL FIELD

This invention relates to a method and apparatus for making electronic circuitry and, more particularly, to such a technique for making printed circuit boards having three dimensional surfaces.

BACKGROUND ART

Surface mount technology has become the technology of choice for electronics assembly in many countries throughout the world. This choice is due to the several benefits offered including the ability to produce higher density printed circuit boards, adaptability to automation, and lower weight. However, as the geometry of integrated circuitry packaging has been reduced greatly, there has been a significant decrease in throughput yield. In this regard, because fine pitch integrated circuits have closely spaced apart, fragile leads, there has been a significant increase in the number of foot-to-solder pad registration problems, and solder bridging during assembly, as compared with the larger size through-hole devices. Thus, significant numbers of printed circuit board assemblies are rejected and must be repaired or discarded.

Several attempts have been made to solve the above-mentioned registration and solder-bridging problems. For example, one such attempt includes using solder mask "dams" between the pads/lands where the leads of a surface-mount integrated circuit are to be soldered. The dam is designed to reduce the possibility of solder-bridging, though the technique adds cost and does not cause self-centering during component placement.

Another attempt to improve throughput yield is disclosed in U.S. Pat. No. 4,913,846 which discloses a three dimensional printed circuit board with grooved solder lands which facilitate greatly the self-location of the fine pitch leads during assembly. Such a technique also reduces coplanarity problems of the circuit component oftentimes having its lead distal ends not being disposed in a common plane. The solder grooves can thus permit a substantial deviation from coplanarity. Also, such grooves help overcome undesired and unwanted solder paste bridge problems during assembly.

While such a three dimensional circuit board has proven to be highly satisfactory, it would be highly desirable to have a method and apparatus for making such a board. In this regard, no manufacturer has been able to successfully manufacture molded printed circuit boards with recesses or grooves in commercial quantities in a suitable manner. For example, the conventional use of metal plating to form metallic traces within the molded printed circuit board grooves after molding has been insufficient to meet standard "peel" and "plug" tests as the nature of the material on the sides and bottom of such grooves causes the plating to be adhered weakly to the substrate surface. Thus, the metallic traces are easily separated from the substrate surface leading to unwanted and undesired electrical failures.

As to the problems relative to adhesion of metallic conductors to printed circuit boards refer to U.S. Pat. No. 3,666,549.

As to the problem, in general, of fixing metal to plastic material, the problem has also existed in the plating-on-plastic technology. See, for example, U.S. Pat. No. 5,073,237. In this form of a plating process, the problem has long existed of the metal separating from its underlying plastic substrate or part.

Therefore, it would be highly desirable to have a new and improved circuit board tool and method of using it to facilitate the manufacture of molded printed circuit boards with recesses or grooves in a relatively inexpensive manner. Moreover, such a method should result in a sufficiently strong bond between the plastic substrate and the metal substrate that metallization within the grooves can pass conventional peel and plug tests.

Another problem associated with molded printed circuit boards with recesses or grooves is that the formation of the grooves within thermoplastic substrates results in cold creep or shrinkage problems leading to misalignment of the grooves on the substrate.

Attempts also have been made to solve groove misalignment due to the cold creep problems, however, such attempts have proven less than totally satisfactory. In this regard, in order to help eliminate or at least greatly reduce the cold creep phenomenon long fibrous materials have been mixed with the plastic material to help eliminate or at least greatly reduce shrinkage. While such fibers help reduced shrinkage they cause the injection molding equipment to malfunction, thus resulting in low production yields due to unwanted and undesired equipment shutdown.

Therefore, it would be highly desirable to have a new and improved circuit board tool that can be used to produce a circuit board with grooves having metallized traces adhered firmly therewithin in a relatively inexpensive manner in acceptable substrate materials without causing unwanted and undesired failures. Moreover, such a circuit board tool should be capable of producing large quantities of printed circuit boards without the use of expensive injection mold tooling.

DISCLOSURE OF INVENTION

Therefore, the principal object of the present invention is to provide a new and improved printed circuit board tool and method of using it to produce large quantities of high density printed circuit boards in a relatively fast, reliable manner while at the same time eliminating or at least greatly reducing registration problems associated with mounting fine pitch integrated circuits to the board. Such a new and improved printed circuit board tool should be relatively inexpensive to manufacture, and should be manufacturable according to efficient mass production techniques.

Another object of the present invention is to provide such a new and improved circuit board tool that can be used to produce a circuit board with grooves or channels having metallized traces adhered firmly therewithin in a relatively inexpensive manner without causing unwanted and undesired failures. Moreover, such a circuit board tool should be capable of producing large quantities of printed circuit boards without the use of expensive injection mold tooling.

A further object of the present invention is to provide such a new and improved circuit board tool and method of using it to facilitate the manufacture of molded printed circuit boards with recesses or grooves in a relatively inexpensive manner. Moreover, such a method should result in a sufficiently strong bond between the plastic substrate and the metal substrate that the metallization within the grooves can pass conventional peel and plug tests.

Briefly, the above and further objects of the present invention are realized by providing a new and improved printed circuit board tool and method of making and using it, to produce three dimensional printed circuit boards having grooves with strongly bonded metallic pads therein.

The printed circuit board tool includes a metallized male mold substrate having a plurality of groove forming projections disposed in the substrate surface. The method of making the metallized male mold includes forming a female parent or predecessor master tool to produce a large number of the metallized male molds for producing new and improved three-dimensional printed circuit boards. The new and improved three-dimensional printed circuit board includes a substrate composed of a high heat deflective plastic, and a plurality of recesses or grooves molded into the substrate surface for receiving therein the fine pitch, closely spaced-apart leads, of an integrated circuit. A plurality of metallized sunken pads are adhered or bonded within each of the grooves for establishing an electrical path therein.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 3:
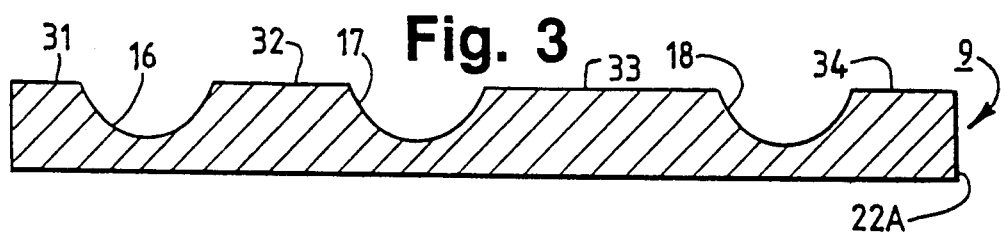
FIG. 3 is a cross-sectional view of a printed circuit board tool which is constructed in accordance with the present invention.

Referring now to the drawings, and more particularly to FIG. 3, there is shown a circuit board tool or female predecessor master tool 9 which is constructed in accordance with the present invention. The circuit board tool 9 is constructed and utilized as described herein for helping to make a three dimensional printed circuit board 10 (FIG. 8) having a plurality of sunken metallized pads or lands, such as the lands 12-14.

The printed circuit board tool 9 generally comprises a copper plate 22A having a set of valleys or grooves such as grooves 16-18 interleaved between a plurality of spaced apart flat portions 31-34. The tool 9 is configured in substantially the same shape as the printed circuit board 10.

Figure 1:
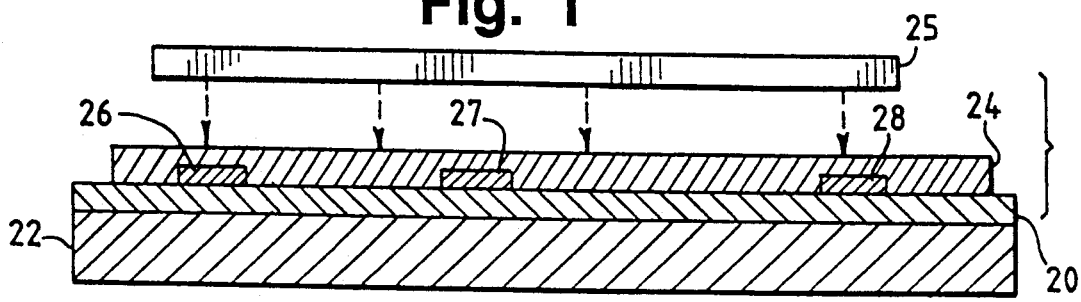
FIG. 1 is a schematic view of an initial step of making a printed circuit board tool of FIG. 3 by applying a coating of photoresist to a copper plate, overlying the coated copper plate with a photo tool, and exposing the photo tool covered copper plate to high intensity light.
Figure 2:
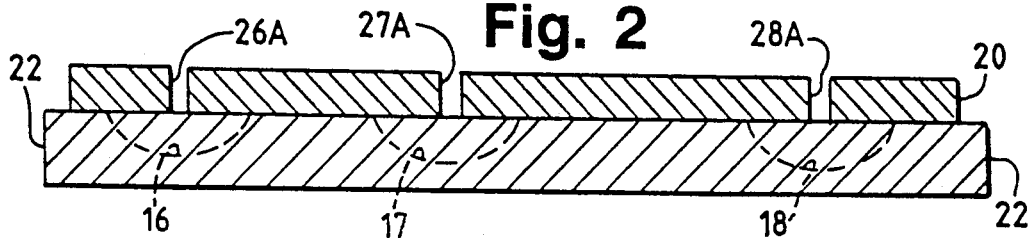
FIG. 2 is a schematic view of the next step of making the printed circuit board tool of FIG. 3 by immersing the covered copper plate in a developer solution.

The method of making the printed circuit board tool 9 is illustrated in FIGS. 1 to 3.

Considering now the initial step of making the printed circuit board tool 9 with reference to FIG. 1, the inventive method is initiated by applying a coating of "photoresist" 20 to the top surface of a plate of etchable material, such as a plate of copper 22. The plate of copper 22 is dimensioned to accommodate a photo tool 24 of the interconnecting traces required for a given printed circuit board layout. The photoresist 20 is applied to the plate of copper 22 conventionally, by either coating the plate 22 in photoresist or by spraying the photoresist material onto the top surface of the plate 22. Dry-film photoresist is another alternative.

Although in the preferred embodiment an etchable copper plate has been disclosed, those skilled in the art will understand that other etchable or abatable materials such as plastics and ceramic materials may be utilized.

As best seen in FIG. 1, after the photoresist 20 has cured on the surface of the copper plate 22, the photo tool 24 is registered or positioned on the coated top surface of the plate 22. Next, the assembly is exposed to a high intensity light, such as a high intensity ultraviolet or laser light 25 for a sufficient period of time to fix portions of the photoresist 20. In this regard, a set of emulsion areas 26-28 on the photo tool 24 protect the photoresist 20 from exposure by blocking the ultraviolet light 25. Those areas of photoresist 20 protected from the ultraviolet light 25 are removed or developed out leaving a plurality of windows of photoresist, such as the windows 26A-28A, within the photoresist material 20. Such windows may be formed by either a developing solution, laser cut, or other suitable techniques.

The photo tool 24 is then removed from the top surface of the copper plate 22. The copper plate 22 is then placed in an etcher (not shown) which dissolves the exposed copper. It should be understood that either a positive or negative imaging technique can be used for preparing the copper plate 22 for etching as will be described hereinafter.

An etching apparatus (not shown) having a series of oscillating nozzles, sprays a relatively mild solution of ferric chloride, under high pressure, onto the surface of the plate 22, via the windows 26A–28A, to remove copper atoms, atom by atom, for forming a water soluble copper chloride by-product. Thus, no unwanted aggressive chemicals are employed in this technique. In this regard, as the copper is removed a series of U-shaped grooves or depressions, such as the grooves 16 to 18 are formed in the copper plate.

After the copper has been converted to a water soluble, copper-based by-product, another series of spray nozzles spray water onto the surface of the plate 22 to dissolve and wash away the by-product from the substrate surface. This process is repeated until the resulting substrate is etched in an outline indicative of the grooves 16–18. Any residual photoresist material on the surface of the substrate is then dissolved and removed resulting in the female master tool 9.

Considering now the female master tool 9 in greater detail with reference to FIG. 3, the female master tool 9 is a finished product tool that may be used many times for forming a large number of male molds, such as a male plastic mold 50 (FIG. 5) that will be described hereinafter.

Figure 4:
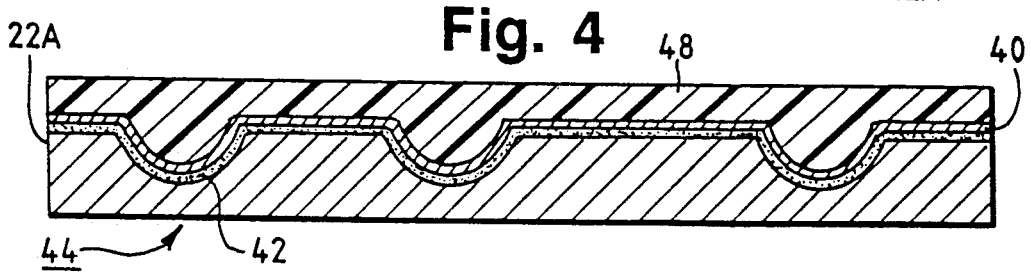
FIG. 4 is a schematic view of the next step of making a printed circuit board of FIG. 8 by coating the printed circuit board tool with a low adhesion material, and electroforming a layer of copper on the coated surface of the printed circuit board tool.
Figure 5:
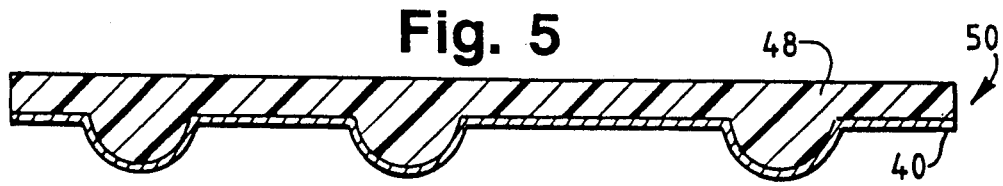
FIG. 5 is a cross sectional view of a male tool mold which is constructed in accordance with the present invention illustrating the male tool mold with a plastic support backing to support a thin electroform.
Figure 5A:
FIG. 5A is a cross sectional view of another male tool mold which is constructed in accordance with the present invention, illustrating the male tool mold with a low-adhesion metal support backing.

The method of making a male plastic mold 50 from the female master tool 9 is illustrated in FIGS. 4 to 5.

Considering now the method of making a male plastic mold 50 with reference to FIG. 4, the inventive method is initiated by spraying the female master tool 9 with a thin coating material 42. In the preferred method, the preferred coating material 42 is a graphite material. Those skilled in the art will understand that other coating materials may be utilized such as a low adhesion bathing solution of water and copper sulfate. In this regard, a sufficient quantity of coating material 42 is adhered to the surface of the tool 9 to form a coated tool having a low adhesion bonding surface.

The coated tool is then subjected to an electroplating process, such as an electrolytic process. In this regard, the electrolytic process causes a thin layer or coating of metallic material such as copper to be deposited on top of the graphite material 42 to form the metal trace 40.

Next, a combination or assembly 44 as shown in FIG. 4 results from forming a plastic backing 48, which is molded or laminated to the exposed top surface of the metallic trace 40. In this regard, the plastic backing 48 is a thermoplastic material if molded to the material 48, or is a thermoset or laminated plastic material. As will be explained hereinafter the plastic backing 48 helps to rigidify the thin metal trace 40.

As best seen in FIG, 5, the plastic male tool mold 50 is formed by removing mechanically and separating the female tool 9 from the combination 44. In this regard, the graphite material 42 has such a sufficiently low adhesion strength, that the male tool mold 50 and the female tool 9 may be separated mechanically in a relatively facile manner.

From the foregoing, it will be understood by those skilled in the art, that the female tool 9 may be used repeatedly to make a large number of the male molds, such as the male mold 50. The male mold 50 is used to make a single printed circuit board, such as the printed circuit board 10.

A male mold 60 may also be formed of nickel with a copper trace by an electroplating process. In this regard, the process is described earlier except a nickel backing 62 is formed by an electroplating process to a copper metallic trace 64, where the trace 64 is substantially similar to trace 40.

While in the preferred embodiment of the present invention an electroplating process was described for forming the trace 40, it will be understood by those skilled in the art that other conventional technique can be employed such as metal flame spraying.

Figure 8:
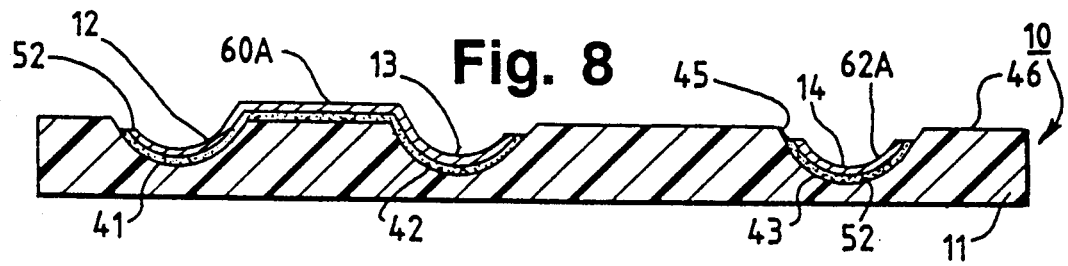
FIG. 8 is a cross sectional view of a the printed circuit board which is constructed in accordance with the present invention.

Considering now the printed circuit board 10 in greater detail with reference to FIG. 8, the printed circuit board 10 generally comprises a dielectric substrate 11 being composed of an organic material such as a palatable high heat deflecture plastic or thermoplastic, and for receiving thereon a plurality of fine pitch integrated circuits (not shown).

A plurality of grooves or recesses, such as the grooves 41–43, are molded into the substrate surface for receiving therein the fine pitch leads of the integrated circuit. For the purpose of simplifying this disclosure, only a small number of grooves have been illustrated. However, those skilled in the art will understand the number of grooves that are molded into the substrate 11 are sufficient to accommodate the total number of fine pitch leads for each integrated circuit disposed on the printed circuit board 10, and others to act as interconnecting recessed traces.

An electrical path is established within each groove by an associated metallized sunken pad or land, such as the lands 12–14. The lands 12–14 include a group of associated electrical current carrying metal traces, such as traces 60A and 62A. Traces 60A and 62A extend along the bottom and sidewalls of their respective grooves and as will be explained hereinafter in greater detail are bonded to the substrate 11 by a coating of a strong adhesive agent, such as a coating of adhesion promote 52.

A series of plastic dams, such as dam 45, between the plastic substrate 11 and each land, such as the land 14 to help retain solder within each groove, such as the groove 43.

The above-described three-dimensional trace geometry permits high interconnect density and good current-currenting currenting capacity in a form that allows self-location and self-soldering capillary action of the fine pitch leads of associated integrated circuits when assembled. Moreover, depending upon the groove depth and width, the individual sunken pads, such as the pad 12, provides as much as one and one-half to fifteen times the amount of metallization per unit of surface area as an ordinary two-dimensional printed circuit board pad or trace. For the purpose of further simplifying this disclosure, only a single interconnecting trace 60A from pad 12 to pad 13 has been shown to pads, or pads to holes. Those skilled in the art however, will understand that such traces have been plated into the substrate 11 to accommodate circuit design requirements.

Figure 6:
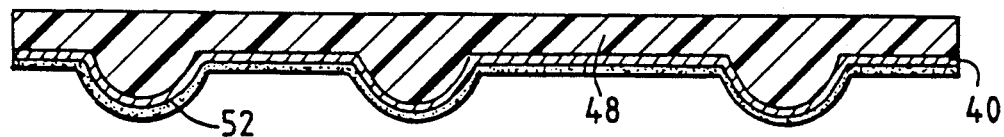
FIG. 6 is a schematic view of the next step of making the printed circuit board of FIG. 8 by immersing the male tool mold in a water-based chemical bath to form a highly adherent dendritic oxide coating on the metallic surface of the male tool mold.
Figure 7:
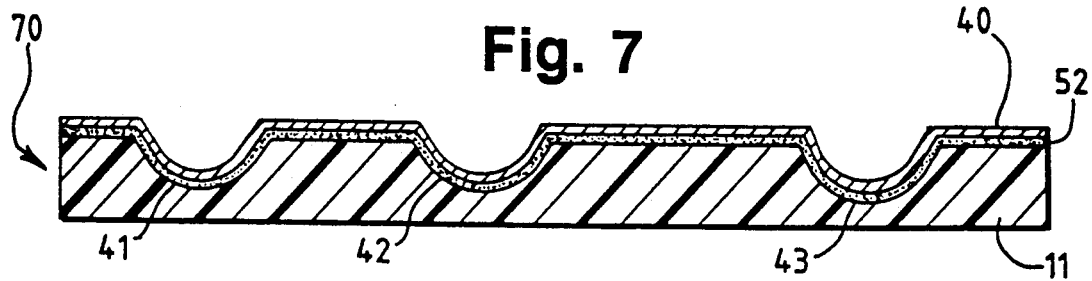
FIG. 7 is a schematic view of the next step of making the printed circuit board of FIG. 8 by bonding a three-dimensional plastic substrate to a metal-backed oxide coating, and separating a backing from the male mold tool.

The method of making the printed circuit board 10 from the male mold 50 is illustrated in FIGS. 6–8.

Considering now the method of making the printed circuit board 10 with reference to FIGS. 6–8, the inventive method commences by applying a thin layer of adhesion promote coating 52 on the surface of the trace 40 of the male tool mold 50. To apply the adhesion promote coating 52, the tool 50 is bathed in a water base bath to form a highly adherent dendritic oxide coating on the trace 40. This wet chemical oxidation treatment prepares the trace 40 for lamination to the substrate 11.

When the trace 40 has been coated with dendritic oxide, the tool 50 is placed in a high heat deflecture plastic molding machine, such as a laminating press used in making multi-layer printed circuit boards (not shown) which under heat and pressure causes a blank 70 to be formed while simultaneously laminating the trace 40 within the grooves 41-43 formed in the plastic substrate 11 of the blank 70.

Next, the thin metallic trace areas interconnecting the pads 12-14 are removed using a conventional hole-plugging, abrasive removal of smudge and open etching to form the printed circuit board 10.

Thus, it is seen there is provided a new and improved method of manufacturing a reusable predecessor tool, such as the tool 9, that may be used repeatedly a large number of times to help produce three-dimensional printed circuit boards.

Figure 9:
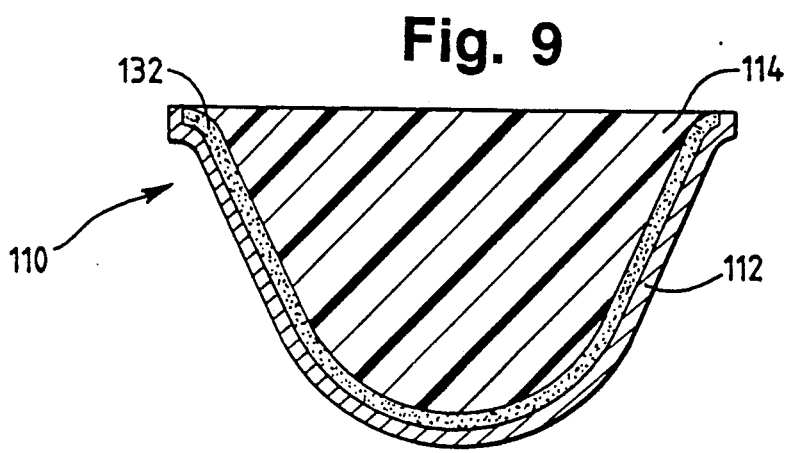
FIG. 9 is a metallized plastic part which is constructed in accordance with the present invention.

Referring now to the drawings, and more particularly to FIG. 9 thereof, there is shown a metallized plastic part 110 which is constructed in accordance with the present invention.

The metallized plastic part 110 generally includes a thin layer of metallic material, such as a thin layer of copper 112 and a plastic member 114 which is shaped complementarily to the layer of copper 112. A layer or coating of bonding material, such as a dendritic oxide coating 132 is disposed between the layer of copper 112 and the plastic member 114 for bonding them together in a substantially permanent manner.

The method for making the metallized plastic part 110 is illustrated in FIG. 10 to 13.

Figure 10:
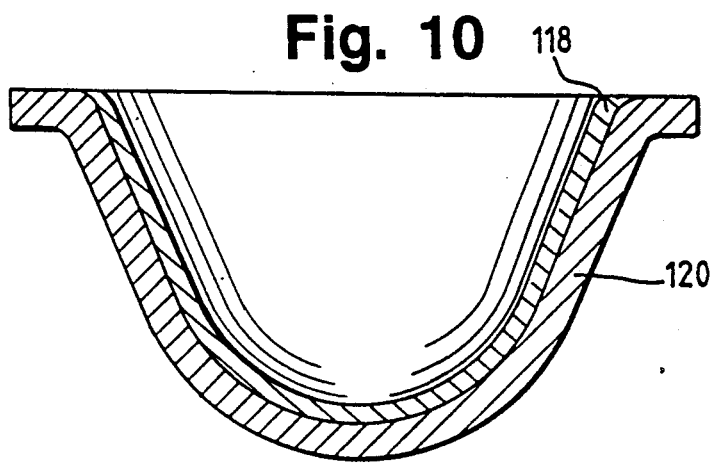
FIGS. 10-13 illustrate the steps of making the metallized plastic part of FIG. 9.

Considering now the initial step of making the metallized plastic part 110 with reference to FIG. 10, the inventive method is initiated by spraying a thin coating of an electrically conductive, weak-adhesion agent, such as a thin coating of a graphite material 118 to a female mold part 120. Alternatively, the mold's surface may be pre-impregnated with the agent which has low adhesion when subsequently electroplated. The female mold part 120 is configured to form the plastic member 114. In this regard, the plastic member 114 can be configured to substantially any desired configuration, such as a substrate with grooves disposed in its surface.

Next, a closure member 122 (FIG. 11) with an O-ring seal 124 is positioned in a sealing relationship with the female mold part 120 to form a cavity indicated generally at 126. A plating bath solution, such as an electrolytic solution 128, is then pumped into the cavity 126 via an inlet/outlet value passageway 127 until the cavity 126 is completely filled.

Figure 11:
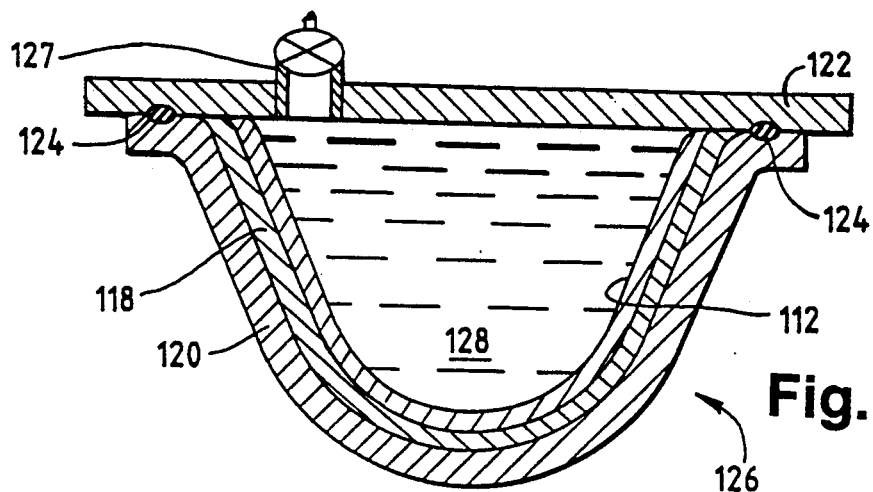

Once the cavity 126 is filled with the electrolytic solution 128 as best seen in FIG. 11, a pair of electrodes (not shown) are energized electrically to cause the thin layer of copper or other electrical depositable material 112 to be deposited onto the graphite surface 118 covering the female mold part 120. In this regard, it should be understood that the female mold part 120 serves as one area for electroplating, while the closure member 122 serves as the other area for electroplating for facilitating the described electroplating process.

When the desired thickness of copper has been electroplated onto the graphite surface 118, the plating bath solution 128 is drained via the inlet/outlet value passageway 127 from the cavity 126. In this regard, a vent (not shown) is disposed in the closure member 122 in order to permit fluids to be drained and flushed from the cavity 126.

Figure 12:
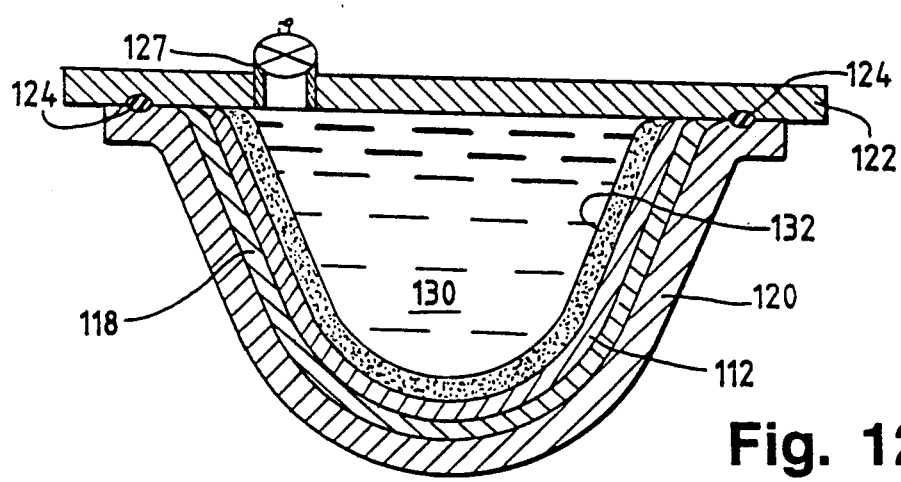
Figure 13:
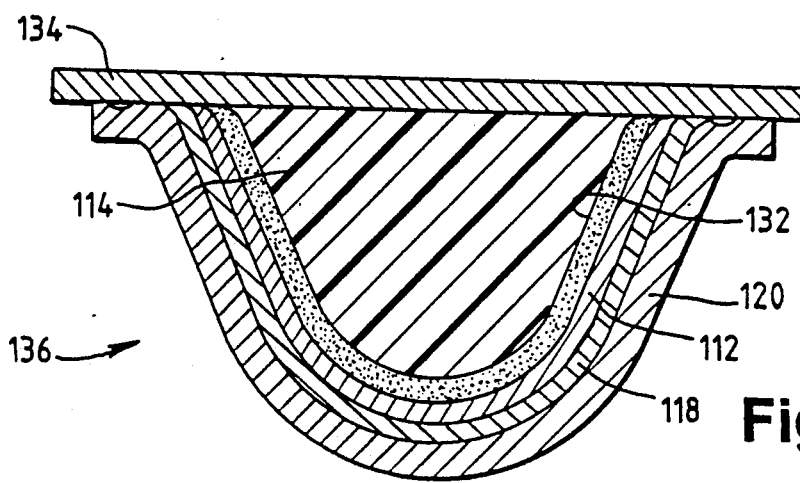

Next, a wet chemical oxidation treatment bath 130 is pumped into the cavity 126 to cover the exposed surface of the copper plating 112 as best seen in FIG. 12. The oxidation bath 130 is then drained from the cavity 126 leaving a highly adherent dendritic oxide coating 132 on the exposed surface of the copper plating 112.

Next, the closure member 122 is removed from sealing engagement with the female mold part 120. A male mold part 134 is then brought into engagement with the female mold part 120 to form a two part mold 136. A plastic material, such as thermoplastic or thermoset plastic material is then injected into the two part mold 136 utilizing a conventional injection molding technique to form the plastic member 114. In this regard, as the plastic 138 is brought into contact with the dendritic oxide coating 132, the coating 132 forms a strong adhesive bond between the surfaces of thermoset and the thin layer of copper 112.

When the two part mold 136 has been filled, the two parts 120 and 134 are then separated. The metallized plastic part 110 is then removed from the female part 120. In this regard, the graphite material 118 is a weak adhesion agent, thus allowing the metallized plastic part 110 to be removed easily from the female mold part 120.

Finally, the graphite material 118 is removed from the surface of the copper plating 112 by simple scrubbing.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. In a method of making a printed circuit board including a planar substrate having thereon a desired electrical circuit pattern with metallized solder lands thereof disposed out of the plane of the substrate, the steps of making a three dimensional female predecessor tool, comprising:

using a photo tool having emulsion areas thereon corresponding to the desired electrical circuit pattern and the metallized out of plane solder lands thereof;

dimensioning a metallic plate to conform to the planar surface area of the printed circuit board;

coating at least one surface of said metallic plate with a light sensitive material;

placing said photo tool on the coated surface of said metallic plate so the emulsion areas thereon are properly aligned on the surface to facilitate formation of the desired electrical circuit pattern and the metallized out of plane solder lands thereof;

exposing said photo tool disposed on said plate to high intensity light to form a desired pattern in said light sensitive material to facilitate formation of the desired metallized out of plane solder lands of the printed circuit board;

removing the unwanted areas of said light sensitive material to expose portions of the metallic plate to be etched with said desired pattern; and etching said desired pattern in the exposed surface of said metallic plate to form in the resulting three dimensional predecessor tool out of plane portions corresponding substantially to the solder lands of the printed circuit board.

2. A three dimensional female predecessor tool made according to the method of claim 1.

3. In a method of making a printed circuit board including a planar substrate having thereon a desired electrical circuit with metallized solder lands thereof disposed out of the plane of the substrate, the steps of making a three dimensional male tool, comprising:

coating a three dimensional female predecessor master tool having out of plane portions corresponding substantially to the out of plane solder lands of the printed circuit board, with a weak adhesion material;

depositing a thin layer of metallic material on the out of plane portions of the coated female predecessor master tool;

forming a backing on the deposited metallic material to help rigidify it;

separating said thin layer of metallic material from said female predecessor master tool to form the resulting three dimensional male mold tool, said male mold tool having metallized out of plane portions complementary shaped relative to the out of plane solder lands of the printed circuit board.

4. A three dimensional male mold tool made according to the method of claim 3.

5. A method of making a three dimensional female predecessor tool according to claim 1, wherein said light sensitive material is photoresist.

6. A method of making a three dimensional female predecessor tool according to claim 1, wherein said high intensity light is ultraviolet light.

7. A method of making a metallized plastic member, comprising:

coating a mold member with a thin layer of weak adhesion material;

electroplating to said mold member a thin layer of metallic material;

coating one surface of said thin layer of metallic material with a strong adhesion promoting substance;

engaging said mold member with another mold member to form a two part mold with a cavity disposed therebetween;

filling substantially said cavity with a sufficient quantity of plastic material to form a plastic member having a desired configuration;

whereby said thin layer of metallic material is bonded adhesively to said plastic member to form the metallized plastic member.

8. A method of making a metallized plastic member according to claim 7, wherein said mold member is configured in the shape of a substrate with a plurality of grooves disposed in the surface thereof.

9. A method of making a metallized plastic member according to claim 8, wherein said substrate is a blank printed circuit board substrate.

10. A method of making a metallized plastic member according to claim 7, wherein said step of electroplating includes coating said mold member with a weak adhesion metallic material.

11. A molded plastic member having an adhesive bonded metallized surface made according to the method of claim 7.

12. A method of making a metallized plastic member comprising:

coating a mold member with a thin layer of weak adhesion material;

electroplating to the coated mold member a thin layer of metallic material;

coating one surface of said thin layer of metallic material with a strong adhesion promoting substance;

engaging said mold member with another mold member to form a two part mold with a cavity disposed therebetween;

filling substantially said cavity with a sufficient quantity of plastic material to form a plastic member having a desired configuration;

whereby said thin layer of metallic material is bonded adhesively to said plastic member to form the metallized plastic member; and wherein said step of coating with a thin layer of weak adhesion material includes bathing said mold member in a weak adhesion solution of water and copper sulfate.

13. A method of making a metallized plastic member comprising:

coating a mold member with a thin layer of weak adhesion material;

electroplating to the coated mold member a thin layer of metallic material;

coating one surface of said thin layer of metallic material with a strong adhesion promoting substance;

engaging said mold member with another mold member to form a two part mold with a cavity disposed therebetween;

filling substantially said cavity with a sufficient quantity of plastic material to form a plastic member having a desired configuration;

whereby said thin layer of metallic material is bonded adhesively to said plastic member to form the metallized plastic member; and wherein said step of coating with a thin layer of weak adhesion material includes spraying said mold member with a thin coating of graphite.

14. A method of making a metallized plastic member comprising:

coating a mold member with a thin layer of weak adhesion material;

electroplating to the coated mold member a thin layer of metallic material;

coating one surface of said thin layer of metallic material with a strong adhesion promoting substance;

engaging said mold member with another mold member to form a two part mold with a cavity disposed therebetween;

filling substantially said cavity with a sufficient quantity of plastic material to form a plastic member having a desired configuration;

whereby said thin layer of metallic material is bonded adhesively to said plastic member to form the metallized plastic member; and wherein said step of coating with a thin layer of metallic material includes vacuum metallizing said mold member with a thin coat of metallic material.

* * * * *